United States Patent
Yoo et al.

(10) Patent No.: US 11,791,315 B2
(45) Date of Patent: *Oct. 17, 2023

(54) SEMICONDUCTOR ASSEMBLIES INCLUDING THERMAL CIRCUITS AND METHODS OF MANUFACTURING THE SAME

(71) Applicant: Micron Technology, Inc., Boise, ID (US)

(72) Inventors: Chan H. Yoo, Boise, ID (US); Owen R. Fay, Meridian, ID (US); Eiichi Nakano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/520,568

(22) Filed: Nov. 5, 2021

(65) Prior Publication Data

US 2022/0059508 A1    Feb. 24, 2022

Related U.S. Application Data

(63) Continuation of application No. 16/503,353, filed on Jul. 3, 2019, now Pat. No. 11,171,118.

(51) Int. Cl.
| | |
|---|---|
| H01L 25/065 | (2023.01) |
| H01L 23/373 | (2006.01) |
| H01L 23/498 | (2006.01) |
| H01L 23/00 | (2006.01) |
| H05K 1/02 | (2006.01) |

(52) U.S. Cl.
CPC ...... *H01L 25/0657* (2013.01); *H01L 23/3738* (2013.01); *H01L 23/49877* (2013.01);
(Continued)

(58) Field of Classification Search
CPC ............ H01L 25/0657; H01L 23/3738; H01L 23/49877; H01L 24/16; H01L 24/17; H01L 24/81; H01L 24/13; H01L 2224/16235; H01L 2224/17519; H01L 2224/14519; H01L 2225/06517; H01L 2225/06548; H01L 2225/06572; H01L 2225/06589; H05K 1/0207; H05K 2201/066; H05K 2201/10159

See application file for complete search history.

(56) References Cited

U.S. PATENT DOCUMENTS

| | | | |
|---|---|---|---|
| 4,383,270 A | 5/1983 | Schelhorn | |
| 6,340,796 B1 * | 1/2002 | Smith | H05K 1/056 |
| | | | 428/113 |

(Continued)

OTHER PUBLICATIONS

CN Patent Application No. 202010620583.3—Chinese Office Action and Search Report, dated Jul. 14, 2023, with English Translation, 11 pages.

*Primary Examiner* — Dao H Nguyen

(74) *Attorney, Agent, or Firm* — Perkins Coie LLP

(57) ABSTRACT

Semiconductor assemblies including thermal layers and associated systems and methods are disclosed herein. In some embodiments, the semiconductor assemblies comprise one or more semiconductor devices over a substrate. The substrate includes a thermal layer configured to transfer thermal energy across the substrate. The thermal energy is transferred from the semiconductor device to the graphene layer using one or more thermal connectors.

20 Claims, 6 Drawing Sheets

(52) U.S. Cl.
CPC ............ *H01L 24/16* (2013.01); *H01L 24/17* (2013.01); *H01L 24/81* (2013.01); *H05K 1/0207* (2013.01); *H01L 2224/16235* (2013.01); *H01L 2224/17519* (2013.01); *H01L 2225/06517* (2013.01); *H01L 2225/06548* (2013.01); *H01L 2225/06558* (2013.01); *H01L 2225/06572* (2013.01); *H01L 2225/06589* (2013.01); *H05K 2201/066* (2013.01); *H05K 2201/10159* (2013.01)

(56) References Cited

U.S. PATENT DOCUMENTS

| | | | |
|---|---|---|---|
| 6,657,864 B1 | | 12/2003 | Dyckman et al. |
| 7,038,142 B2 | | 5/2006 | Abe |
| 11,171,118 B2 | * | 11/2021 | Yoo ........................ H01L 24/16 |
| 2003/0136577 A1 | | 7/2003 | Abe |
| 2006/0104035 A1 | * | 5/2006 | Vasoya ................ H05K 1/0207 |
| | | | 257/E23.101 |
| 2007/0215381 A1 | | 9/2007 | Vasoya |
| 2013/0322081 A1 | | 12/2013 | Pan et al. |
| 2016/0057854 A1 | | 2/2016 | Schneider et al. |
| 2016/0095201 A1 | | 3/2016 | Min et al. |
| 2016/0249445 A1 | * | 8/2016 | Min ..................... H05K 3/4608 |
| 2018/0090451 A1 | * | 3/2018 | Matsubara ........ H01L 23/49838 |
| 2019/0174638 A1 | * | 6/2019 | Silvano de Sousa ........................ |
| | | | H05K 1/0209 |
| 2021/0005575 A1 | | 1/2021 | Yoo et al. |

* cited by examiner

SEMICONDUCTOR ASSEMBLIES INCLUDING THERMAL CIRCUITS AND METHODS OF MANUFACTURING THE SAME

CROSS-REFERENCE TO RELATED APPLICATION(S)

This application is a continuation of U.S. application Ser. No. 16/503,353, filed Jul. 3, 2019; which is incorporated herein by reference in its entirety.

This application contains subject matter related to an U.S. Patent Application by Chan H. Yoo and Owen R. Fay entitled "SEMICONDUCTOR ASSEMBLIES INCLUDING VERTICALLY INTEGRATED CIRCUITS AND METHODS OF MANUFACTURING THE SAME," which is assigned to Micron Technology, Inc., and is identified as U.S. application Ser. No. 16/503,363, filed Jul. 3, 2019, and is incorporated herein by reference in its entirety.

TECHNICAL FIELD

The present technology is directed to semiconductor devices, such as memory devices and processors, and several embodiments are directed to semiconductor assemblies that include thermal circuits.

BACKGROUND

The current trend in semiconductor fabrication is to manufacture smaller and faster devices with a higher density of components for computers, cell phones, pagers, personal digital assistants, and many other products. All semiconductor devices generate heat, and dissipating such heat is necessary for optimum and reliable operation of high-performance devices. Moreover, as speed and component density increase, the heat becomes a limiting factor in many products. For example, high-performance devices that generate from 80-100 watts may not operate at rated levels or may degrade unless some of the heat is dissipated. Accordingly, heat dissipation is a significant design factor for manufacturing microfeature devices.

FIG. 1A is a top view of a conventional semiconductor device assembly 100 ("assembly 100"), and FIG. 1B is a schematic cross-sectional view of the assembly 100 shown in FIG. 1A taken along line 1B-1B of FIG. 1A. Referring to FIGS. 1A and 1B together, the assembly 100 includes one or more semiconductor devices attached to an assembly substrate 102 (e.g., a printed circuit board (PCB)), such as a motherboard. The assembly 100 includes one or more modules 104 that each include one or more semiconductor devices 106 (e.g., dies or packages) attached to a module substrate 108 (e.g., PCB). The modules 104 include memory modules, such as dual inline memory modules (DIMMs), that include dynamic random-access memory (DRAM) chips (e.g., flip chips) that are attached to the PCB via solder.

The semiconductor devices 106 generate heat during operation. Conventional designs rely on heat spreaders 110 that draw thermal energy away from the semiconductor devices 106 and into a surrounding environment. However, the heat spreaders 110 take up space, thereby significantly increasing the device footprint. Further adding to the complexity, the heat spreaders 110 transfer the thermal energy through contacting surfaces. Thus, unless the contacting surface sufficiently and/or evenly covers heat-generating locations within the semiconductor devices 106, the heat sinks and the heat spreaders cause uneven temperatures across the component that can lead to structural changes or deformations over time. Moreover, as shown in FIG. 1B, the increased density often reduces separation distances between the semiconductor devices 106 and the heat spreaders 110. As such, the heat generated by one component can affect an adjacent component, greatly reducing heat dissipation due to connection between components.

Other conventional components typically do not have heat dissipation components. For example, the carriers for the semiconductor devices 106, such as the assembly substrate 102 and/or the module substrate 108, are typically configured to provide a structural attachment/support for the devices and/or electrical connections for the devices. Such substrates or boards often include a core 112 surrounded by outer layers 114. The core 112 often includes woven fiberglass (e.g., FR-4), which is a thermal insulator. Additionally, the outer layers 114 often include material (e.g., solder mask) that also acts as a thermal insulator.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Several embodiments of semiconductor devices, packages, and/or assemblies in accordance with the present technology can include a thermal routing circuit that is specifically configured to route and dissipate thermal energy away from one or more heat-generating components (e.g., processing and/or memory dies). In routing the thermal energy, the thermal routing circuit can route or transfer the thermal energy along one or more directions (e.g., along a horizontal plane) different from natural directions (e.g., along vertical or upward directions) of heat transfer. In some embodiments, the thermal routing circuit can include a thermal transfer layer or trace, a thermal via, a thermal connector, a heat spreader, or a combination thereof. In one or more embodiments, the thermal transfer layer or trace can include a graphene structure configured to transfer thermal energy across a plane. Details regarding the thermal routing circuit are described below.

Figure 2A:
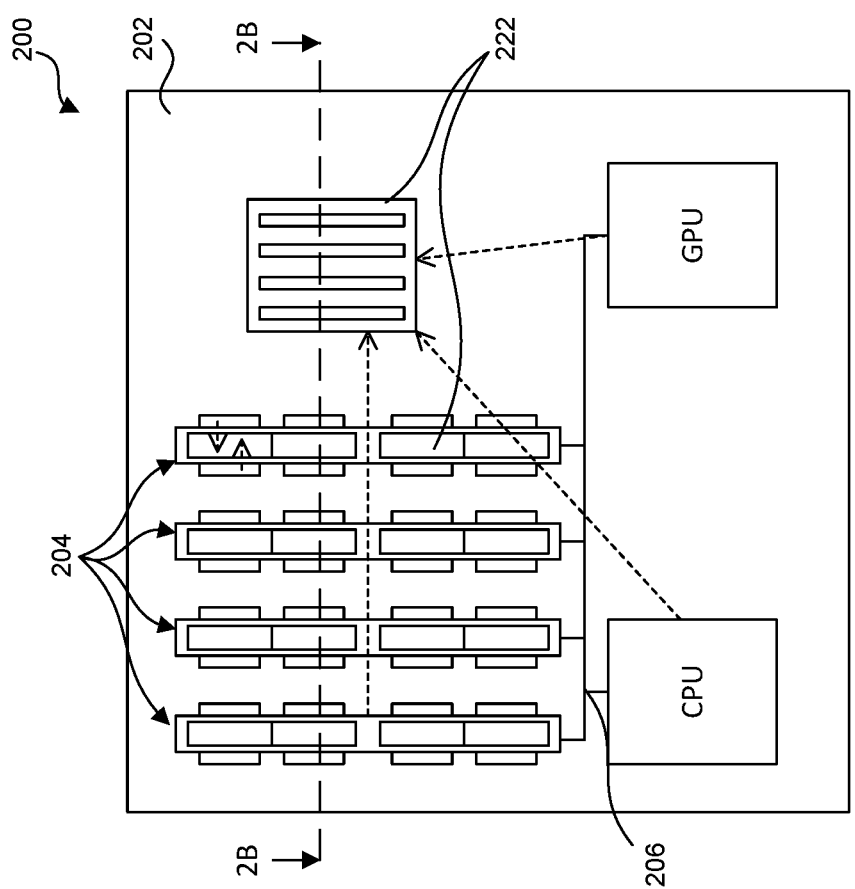
FIG. 2A is a top view of a semiconductor device assembly in accordance with embodiments of the technology.
Figure 2B:
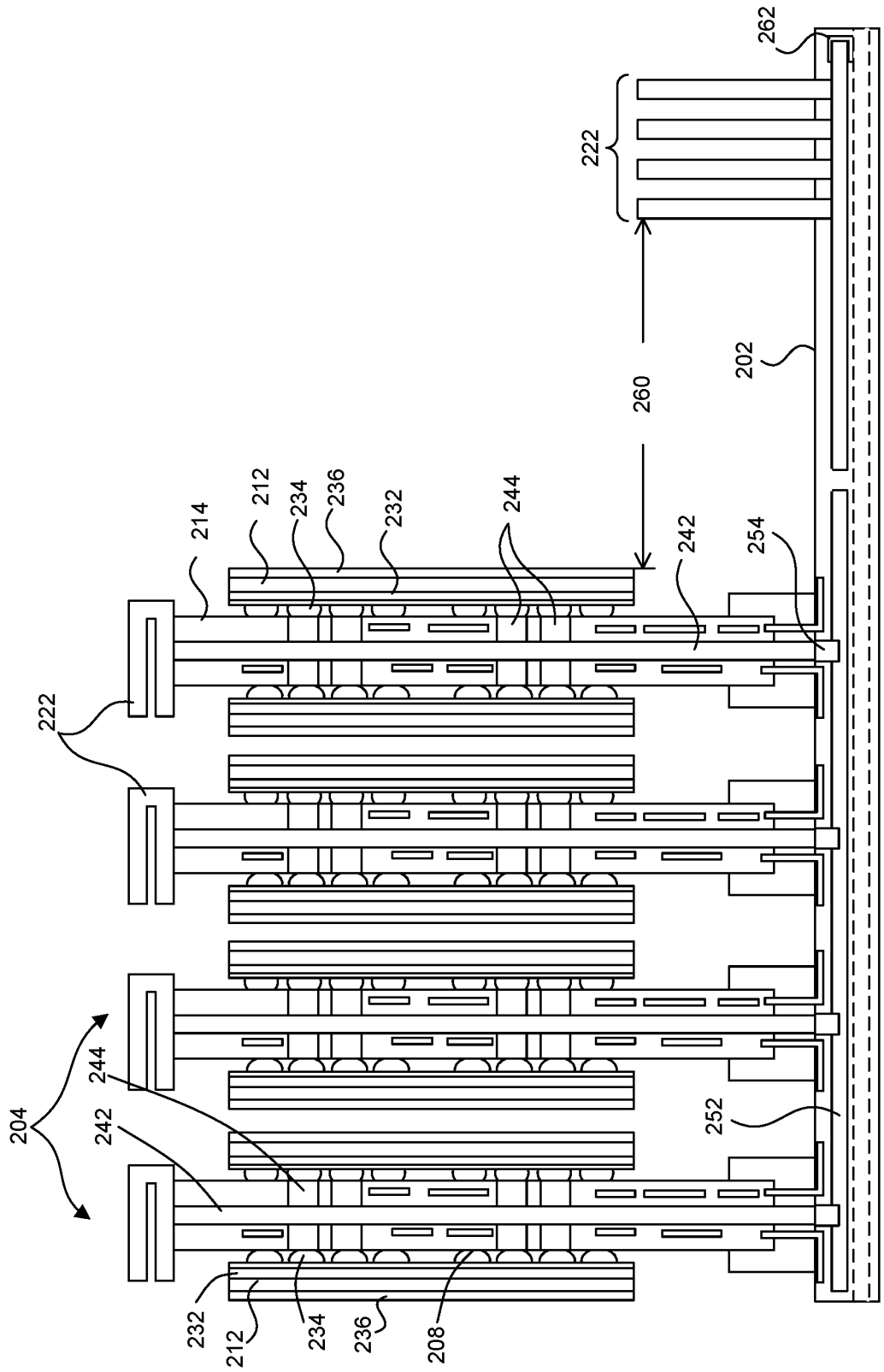
FIG. 2B is a schematic cross-sectional view of the semiconductor device assembly shown in FIG. 2A taken along line 2B-2B of FIG. 2A, and configured in accordance with embodiments of the technology.

FIG. 2A is a top view of a semiconductor device assembly 200 ("assembly 200"), and FIG. 2B is a schematic cross-sectional view of the semiconductor device assembly 200 shown in FIG. 2A taken along line 2B-2B of FIG. 2A. Referring to FIGS. 2A and 2B together, the assembly 200 can include semiconductor devices connected to an assembly structure 202 (e.g., a PCB), such as a motherboard. In some embodiments, the assembly 200 can include semiconductor modules 204 that include one or more semiconductor devices 212 (FIG. 2B, e.g., semiconductor dies and/or packages) mounted on module substrates 214 (e.g., PCBs). As illustrated in FIG. 2A, the semiconductor modules 204 can include memory modules, such as dual inline memory modules (DIMMs), that include dynamic random-access memory (DRAM) chips (e.g., flip chips) attached to the PCB via solder. In some embodiments, the assembly 200 can further include other semiconductor devices, such as processors (e.g., central processing units (CPUs) and/or graphics processing units (GPUs)) attached directly to the assembly structure 202.

The assembly 200 can include electrical connections 206 of FIG. 2A that electrically couple the various components on the assembly structure 202, thereby forming an electrical circuit(s). Some examples of the electrical connections 206 can include wires and/or surface traces that communicate signals and/or voltages between connected components. Other examples of the electrical connections 206 can include electrically conductive structures embedded within one or more components, such as traces and/or connection planes embedded in the assembly structure 202, through vias in the assembly structure 202 and/or vias (e.g., through silicon vias (TSVs)) in the semiconductor components, or a combination thereof. Further, the electrical connections 206 can include component electrical connectors 208 of FIG. 2B that conduct electrical signals/voltages between the connected structures. For example, the component electrical connectors 208 can include solder bumps, bond wires, and/or conductive pillars that connect the semiconductor devices to the module substrates 214 and/or the assembly structure 202. Also, the component electrical connectors 208 can include combinations of pins and receptacles that connect the semiconductor modules 204 to the assembly structure 202.

Along with the electrical connections 206, the assembly 200 can include thermal conductors configured to transfer thermal energy to and from connected components. Accordingly, the assembly 200 can include a thermal circuit used to transfer heat from one or more components (e.g., the semiconductor devices) to heat dissipating components, such as heat spreaders 222. In one or more embodiments, the thermal conductors can include graphene structures (e.g., traces and/or layers) configured to transfer thermal energy along a plane. Graphene material can be carbon arranged along one or more layers such that the carbon atoms are arranged in a hexagonal lattice along a plane. Accordingly, the graphene structure can be both electrically and thermally conductive. In some embodiments, the thermal conductors can further include metallic structures (e.g., copper, aluminum, etc.) configured to transfer the thermal energy between the connected components.

In one or more embodiments, the thermal conductors (e.g., the graphene structures) can be embedded within and/or integral with the semiconductor devices and/or the substrates (e.g., PCBs). For example, the thermal conductors can be used to form a device-thermal circuit, a module thermal circuit, an assembly thermal circuit, or a combination thereof. In some embodiments, the thermal conductors can be further configured to simultaneously provide electrical connections (e.g., power and/or grounding connections) for the assembly 200. In other embodiments, the thermal conductors can be electrically isolated from the electrical connections 206.

The device-thermal circuit can include a set of structures (e.g., components of/within the semiconductor devices 212 and/or attached thereto), such as a device-thermal layer 232, one or more thermal connectors 234 coupled to the device-thermal layer 232, and/or one or more of the heat spreaders 222, configured to route the thermal energy through and dissipate out of the semiconductor devices 212. In some embodiments, the device-thermal layer 232 can include paths (e.g., traces) and/or planar structures made of metallic and/or graphene material and configured to transfer thermal energy from a corresponding semiconductor device 212 along/across a plane. The thermal connectors 234 can include thermally conductive (e.g., metallic material) structures configured to transfer thermal energy out of the thermal layer 232 and the corresponding semiconductor device 212. For example, the thermal connectors 234 can include conductive bumps, connectors, and/or other metallic structures commonly used to communicate electrical signal between devices. The device-thermal layer 232 can absorb and route the thermal energy along a plane (e.g., a vertical plane as shown in FIG. 2B) throughout or along the semiconductor device 212. In some embodiments, the device-thermal layer 232 can be attached to (via, e.g., thermally-conductive adhesives). In some embodiments, the device-thermal layer 232 can directly contact the thermal connectors 234 and provide an additional path for the thermal energy to exit the semiconductor device 212.

As described above, in some embodiments, the thermal connectors 234 can be electrically isolated from the electrical connections 206 and configured to transfer the thermal energy only. In other embodiments, the thermal connectors 234 can be used to electrically connect the semiconductor devices 212 to other devices and/or voltage levels (e.g., power or ground). Further details regarding the device-thermal circuit are described below.

Similar to the device-thermal circuit, the module thermal circuit can include a set of structures, such as a module-thermal layer 242 and/or one or more thermal vias 244, configured to route the thermal energy through and dissipate out of the semiconductor modules 204. The thermal vias 244 can include thermally-conductive structures (e.g., metallic structures) configured to transfer thermal energy in and/or out of the corresponding semiconductor modules 204. In some embodiments, the thermal vias 244 can directly contact the thermal connectors 234 and transfer the thermal energy from the attached semiconductor device to the module-thermal layer 242. The module-thermal layer 242 can include paths (e.g., traces) and/or planar structures made of metallic and/or graphene material and configured to transfer thermal energy along/across a plane. In some embodiments, the module-thermal layer 242 can transfer the thermal energy along a direction/plane that is orthogonal to a direction of transfer through the thermal vias 244. As illustrated in FIG. 2B, the module-thermal layer 242 can be configured to transfer the thermal energy along a vertical plane to module heat spreaders (e.g., one or more instances of the heat spreaders 222). The module heat spreaders can be directly attached (via, e.g., thermally-conductive adhesives) to the module substrate 214 and/or the module-thermal layer 242 therein. Accordingly, the module heat spreader 246 can be configured to receive and dissipate the heat (e.g., the thermal energy generated by the semiconductor devices 212) transferred through/across the module substrate 214 via the module-thermal layer 242.

In some embodiments, the module-thermal layer 242 can further be connected to the assembly structure 202 and/or the assembly thermal circuit therein. The assembly thermal circuit can include a set of thermally conductive structures, such as an assembly thermal layer 252, an assembly thermal connector 254, or a combination thereof, configured to route the thermal energy through/across the assembly structure 202. The assembly thermal connectors 254 can include thermal vias or other metallic structures that can connect or thermally couple the module-thermal layer 242 to the assembly thermal layer 252. Similar to the module-thermal layer 242, the assembly thermal layer 252 can include paths (e.g., traces) and/or planar structures made of metallic and/or graphene material and configured to transfer thermal energy along/across a plane.

As illustrated in FIG. 2B, the assembly thermal layer 252 can transfer the thermal energy along a lateral plane to an assembly heat spreader (one or more instances of the heat spreaders 222). The assembly heat spreader can include heat spreading fins thermally coupled (via, e.g., direct contact and/or thermal interface material (TIM)) to the assembly thermal layer 252. The assembly heat spreader can be configured to dissipate the thermal energy, such as the heat generated by the semiconductor devices 212, carried through the assembly thermal layer 252. The assembly heat spreader and the heat-generating sources (e.g., the semiconductor devices 212) can be separated by a separation distance 260 measured along a direction (e.g., a horizontal direction) parallel to the direction of heat transfer across the assembly thermal layer 252.

Accordingly, the semiconductor device assembly 200 can use the thermal connectors 234, the module-thermal layer 242, the thermal vias 244, and/or the assembly thermal layer 252 to transfer the heat from the semiconductor devices 212 across one or more substrates (e.g., PCBs) and dissipate it at a different location. The separation between the heat source and the dissipation location improves the heat management capacity for the semiconductor device assembly 200. The separation distance allows the thermal energy to be dissipated over a wider area and reduces the thermal concentration within a given area. Further, the thermal circuitry described above allows the semiconductor device assembly 200 to distribute the thermal energy to different locations over a wider area.

Figure 1A:
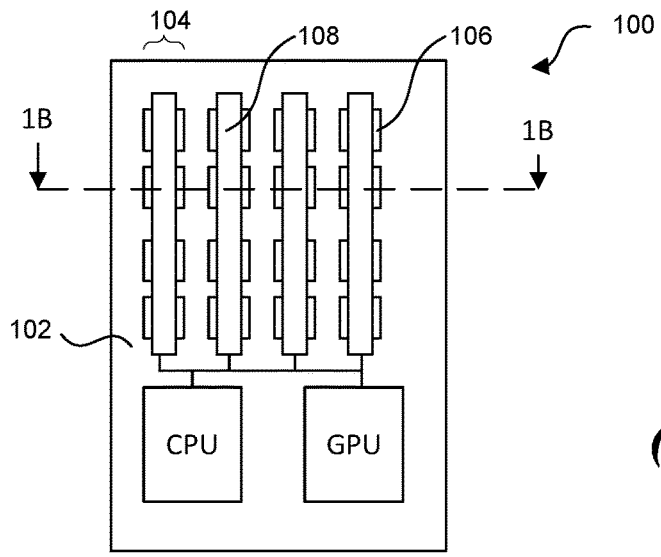
FIG. 1A is a top view of a conventional semiconductor device assembly.
Figure 1B:
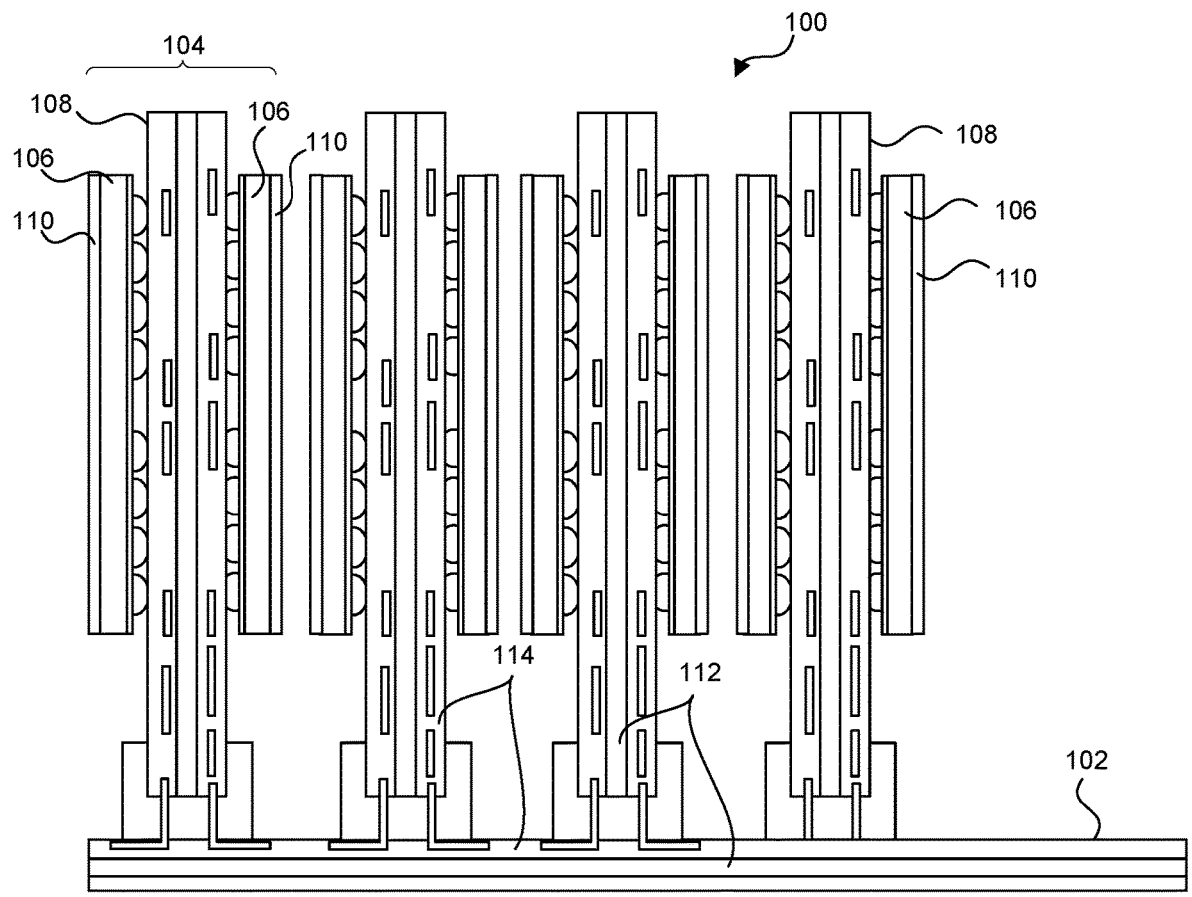
FIG. 1B is a schematic cross-sectional view of the conventional semiconductor device assembly shown in FIG. 1A taken along line 1B-1B of FIG. 1A.

In some embodiments, the thermal layers (e.g., the module-thermal layer 242 and/or the assembly thermal layer 252) can act as cores for the respective substrates. In other words, the thermal layers can replace the traditional core 112 of FIG. 1, such as fiberglass cores, for PCBs. In other embodiments, the thermal layers can be included in the respective substrates in addition to the traditional core 112 (illustrated using dashed lines in FIG. 2B).

When the thermal layers replace the traditional core 112, in some embodiments, the substrates can further include a stiffener 262 configured to structurally reinforce the thermal layers. In some embodiments, the stiffener 262 can include mechanical structures, such as braces, plates, beams, etc. configured to provide rigidity for the corresponding substrate. Accordingly, the stiffener 262 can reduce physical stress, impact, bend, etc. on the thermal layers that may be caused by external forces.

In some embodiments, the thermal layers can include a configuration (e.g., shape, holes, and/or dimensions) for attachment relative to other external layers of the substrate. For example, the graphene layers can be encased within the external layer (e.g., laminate) such that top and bottom surfaces and at least one peripheral side of the graphene layer are covered by the external layer. Also, the graphene layer can include depressions or holes that can contact protrusions of other layers/portions of the substrate, thereby affixing the graphene layer to the other layers/portions. In some embodiments, an epoxy material (e.g., for the external layer) can be laminated or formed to fill the depressions/holes in the graphene layer and then cured to affix the graphene layer.

Figure 3:
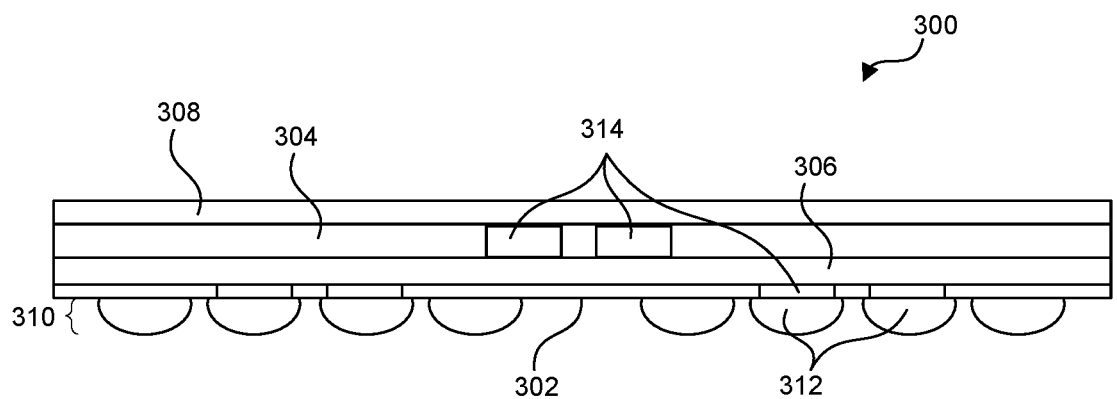
FIG. 3 is a schematic cross-sectional view of a semiconductor device in accordance with embodiments of the technology.

FIG. 3 is a schematic cross-sectional view of a semiconductor device 300 in accordance with embodiments of the technology. The semiconductor device 300 can include a semiconductor die and/or a semiconductor package. As illustrated in FIG. 3, for example, the semiconductor device 300 can include a flip chip. In some embodiments, the semiconductor device 300 can include a logic or a processing device, a memory device, and/or a combination device.

In some embodiments, the semiconductor device 300 can include active circuitry (e.g., transistors) formed on an active surface 302 that is over a semiconductor substrate 304 (e.g., silicon substrate). As described above, the semiconductor device 300 can include the device-thermal circuit of FIG. 2 for distributing and routing the thermal energy generated by the active circuitry. The semiconductor device 300 can include a thermal distribution layer 306 (e.g., graphene traces and/or graphene plate) configured to transfer thermal energy along a plane. For example, the semiconductor device 300 can transfer the heat generated by active circuitry across the semiconductor substrate 304 along a horizontal direction as illustrated in FIG. 3.

In some embodiments, the semiconductor device 300 can include a heat spreader 308 configured to disperse heat generated by the active circuitry. The heat spreader 308 can be attached to the semiconductor substrate 304 opposite the active surface 302.

The semiconductor device 300 can include external connectors 310 (e.g., solder bumps or pillars) configured to couple the semiconductor device 300 to an external circuit/structure. The external connectors 310 can include electrical connectors and/or thermal connectors 312. The thermal connectors 312 can include metallic structures configured to transfer the thermal energy along a direction (e.g., a vertical direction) orthogonal to the thermal distribution layer 306.

In some embodiments, the semiconductor device 300 can include TSVs 314 configured to transfer the thermal energy within the semiconductor device 300 along a direction (e.g., a vertical direction) orthogonal to the plane of the thermal distribution layer 306. The TSVs 314 can be thermally coupled (via, e.g., direct contact and/or TIM) to the thermal distribution layer 306. In one or more embodiments, the TSVs 314 can be further coupled to the thermal connectors 312 and/or the heat spreader 308.

The thermal distribution layer 306 (e.g., graphene layer) and/or the TSVs 314 provide increased thermal management for the semiconductor device 300. Rather than relying on the semiconductor substrate 304, which is typically a thermal insulator, to transfer the heat away from the active circuitry, the graphene structure can increase efficiency in transferring the heat horizontally. Accordingly, the graphene layer can reduce hotspots within the semiconductor device 300. Further, the graphene layer, the TSVs 314, and the thermal connectors 312 can provide an additional route (i.e., unavailable in traditional devices) for removing the heat out of the semiconductor device 300.

Figure 4:
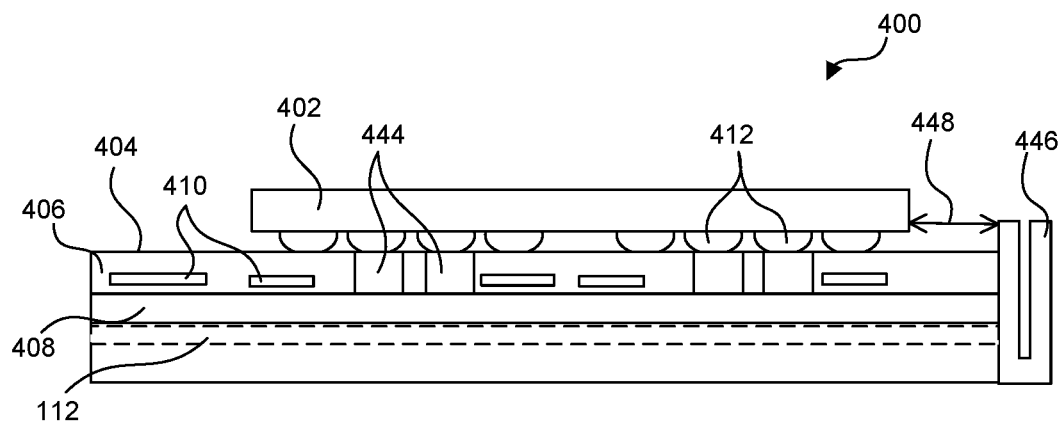
FIG. 4 is a schematic cross-sectional view of a semiconductor module in accordance with embodiments of the technology.

FIG. 4 is a schematic cross-sectional view of a semiconductor module 400 in accordance with embodiments of the technology. In some embodiments, the semiconductor module 400 can include a circuit card. For example, the semiconductor module 400 can include a memory module, such as a dual-inline memory module (DIMM). In some embodiments, the semiconductor module 400 can include a semiconductor device 402 mounted over a module substrate 404 (e.g., PCB). The semiconductor device 402 (e.g., the semiconductor device 300 of FIG. 3) can be attached to the module substrate 404 via external connectors, such as solder bumps, lead wires, etc.

As described above, the semiconductor module 400 can include the module thermal circuit of FIG. 2 for distributing and routing the thermal energy generated by the semiconductor device 402. The semiconductor module 400 can include thermal connectors 412 configured to transfer heat out of the semiconductor device 402 and into the module substrate 404. The module substrate 404 can include thermal vias 444 extending at least partially through an external layer 406 (e.g., polymer material, such as for solder mask) of the module substrate 404. The thermal vias 444 can be exposed at a top surface of the external layer 406 and thermally coupled (via, e.g., direct contact and/or TIM) to the thermal connectors 412. Accordingly, the thermal vias 444 can be used to transfer the thermal energy received from the semiconductor device 402 through the thermal connectors 412.

The semiconductor module 400 can include a thermal distribution layer 408 (e.g., graphene traces and/or graphene plate) configured to transfer thermal energy along a plane. For example, using the thermal distribution layer 408 and the thermal vias 444, the semiconductor module 400 can receive and transfer the heat generated by the semiconductor device 402 across the module substrate 404 along a horizontal direction as illustrated in FIG. 4. In some embodiments, the thermal distribution layer 408 can be embedded in the external layer 406 such that the external layer 406 can cover a bottom surface, a top surface, and/or at least one peripheral surface. In some embodiments, the module substrate 404 can include the core 112 (e.g., fiberglass material) in addition to the thermal distribution layer 408. In other embodiments, the thermal distribution layer 408 can replace the traditional core 112.

The module substrate 404 can include an electrical connection layer 410 (e.g., traces and/or planes) for providing electrical connections. In some embodiments, the electrical connection layer 410 can be electrically isolated from the thermal distribution layer 408. In other embodiments, the electrical connection layer 410 can be coupled to the thermal distribution layer 408. For example, the thermal distribution layer 408 can connect the semiconductor device 402 to a voltage source and/or ground.

In some embodiments, the semiconductor module 400 can include one or more heat spreaders 446 thermally coupled to the thermal distribution layer 408. For example, the heat spreaders 446 can be attached to a top surface, a bottom surface, and/or a peripheral surface of the module substrate 404. The heat spreaders 446 can be separated by a distance 448 from the semiconductor device 402. Accordingly, the heat spreaders 446 can receive and dissipate the thermal energy from the semiconductor device 402 at a location removed by the distance 448 from the semiconductor device 402.

Figure 5A:
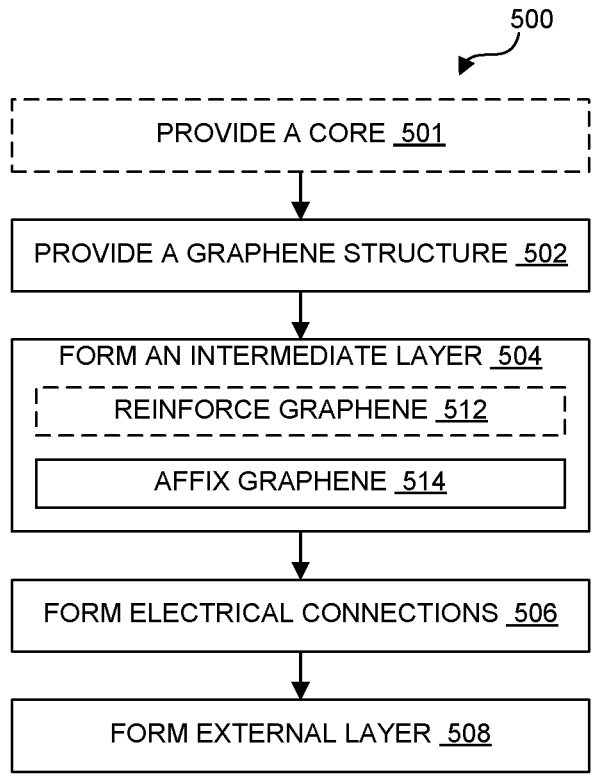
FIG. 5A is a flow chart illustrating a method of manufacturing a substrate in accordance with embodiments of the technology.

FIG. 5A is a flow chart illustrating a method 500 of manufacturing a substrate in accordance with embodiments of the technology. The method 500 can be for manufacturing one or more substrates described above, such as the assembly structure 202 and/or the module substrate 214 illustrated in FIG. 2B. The method 500 can be for manufacturing one or more components of the thermal circuit (e.g., the thermal conductors) described above.

In some embodiments, such as illustrated at block 501, core structure (e.g., the core 112 of FIG. 1) can be provided. For example, fiberglass or other appropriate structure can be provided to serve as the core 112 for the substrate.

At block 502, a graphene structure or other thermally-conductive material can be provided. When the core structure is available, the graphene structure can be connected or attached to the core. Otherwise, the graphene structure can be utilized as the core. The graphene structure can include traces and/or plates that can be arranged along a plane.

At block 504, an intermediate layer can be formed over the graphene layer. The intermediate layer can include an electrical insulator. For example, a polymer/resin material can be applied over the graphene structure and cured, such as via light, chemical agent, heat, etc. In some embodiments, as illustrated at block 512, the graphene structure can be structurally reinforced, such as via a separate rigid structure or via forming a rigid intermediate layer.

In some embodiments, as illustrated at block 514, the graphene structure can be affixed. For example, the material for the intermediate layer can fill depressions and/or holes in the graphene structure prior to curing. Accordingly, the cured material can contact and provide a compression-fit and/or a lock between the intermediate layer and the graphene layer. In some embodiments, the graphene structure can be locked based on attaching the graphene structure to the intermediate layer using an adhesive.

At block 506, electrical connections (e.g., traces and/or plates) can be formed over the intermediate layer. For example, forming the electrical connections can include forming masks and then depositing metallic material (e.g., copper, aluminum, etc.) in openings of the masks. In some embodiments, forming the electrical connections can include forming thermal vias 244 of FIG. 2, such as via masking and then depositing metallic material.

At block 508, an external layer (e.g., polymer material, such as solder mask) can be formed over the intermediate layer and the electrical connections. For example, the external layer can be formed by laminating the polymer material over the intermediate layer and the electrical connections. Also, similar to the intermediate layer, the external layer can be formed based on applying the polymer material and curing the polymer material.

Figure 5B:
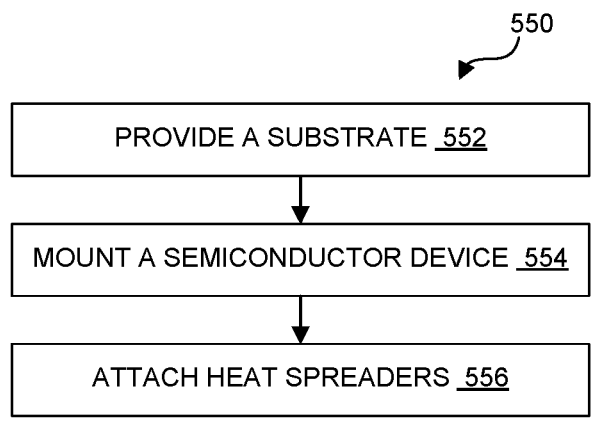
FIG. 5B is a flow chart illustrating a method of manufacturing a semiconductor module in accordance with embodiments of the technology.

FIG. 5B is a flow chart illustrating a method 550 of manufacturing a semiconductor module in accordance with embodiments of the technology. The method 550 can be for manufacturing the semiconductor assembly 200 of FIG. 2A or a portion thereof (e.g., the module), the semiconductor module 400 of FIG. 4, or a combination thereof. The method 550 can be for forming the thermal circuit illustrated in FIG. 2B or a portion thereof, such as the device-thermal circuit, the module thermal circuit, the assembly thermal circuit or a combination thereof.

At block 552, a substrate (e.g., PCB) can be provided. For example, substrate structures, such as the module substrate 214 of FIG. 2A and/or the module substrate 404 of FIG. 4, can include one or more thermal layers (e.g., graphene structures) configured to transfer the thermal energy across a plane as described above.

At block 554, a semiconductor device (e.g., a die, a package, a module, etc.) can be mounted over the substrate. For example, the semiconductor device 212 of FIG. 2B and/or the semiconductor device 300 of FIG. 3 can be mounted over the substrate. Also, the semiconductor module 400 of FIG. 4 can be attached to the assembly structure 202 of FIG. 2A. In some embodiments, mounting the semiconductor device can include placing the device and reflowing the solder. In other embodiments, mounting the semiconductor device can include attaching the device to the substrate (via, e.g., an adhesive) and/or separately attaching electrical connections (e.g., bond wires) to the semiconductor device.

At block 556, one or more heat spreaders can be attached to the substrate. For example, the heat spreaders 222 (e.g., device heat spreaders 236, the module heat spreaders, and/or the assembly heat spreaders 256 illustrated in FIG. 2B) can be thermally coupled to thermal distribution layers (e.g., graphene structure). The heat spreaders 222 can be thermally coupled via direct contact with the graphene structure and/or via TIM.

Figure 6:
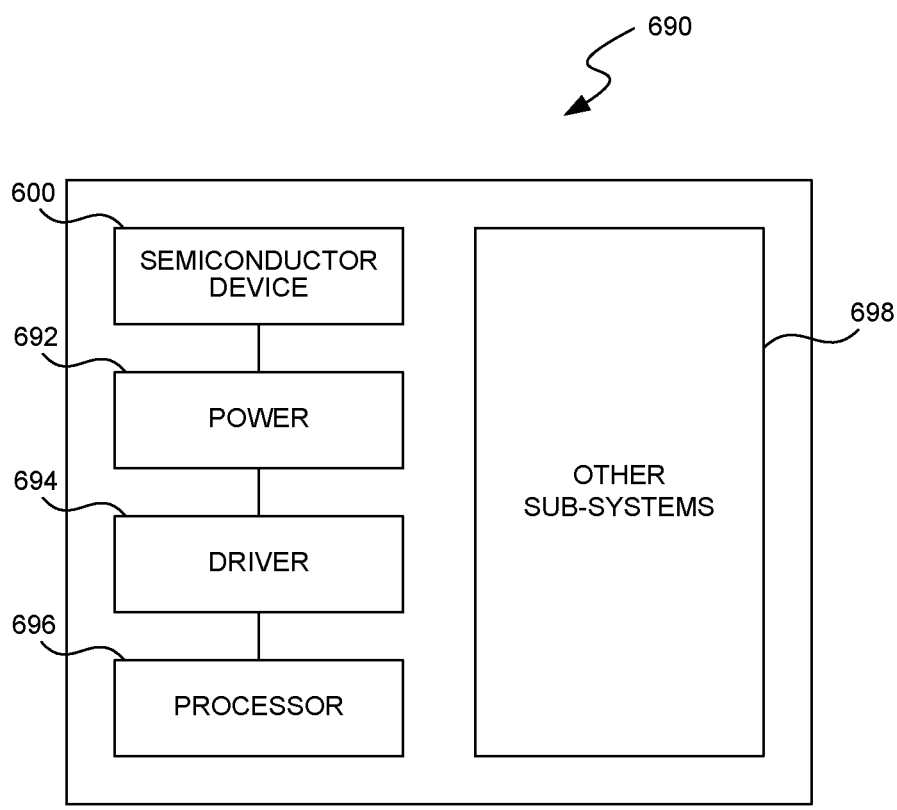
FIG. 6 is a schematic view of a system that includes a semiconductor assembly configured in accordance with embodiments of the present technology.

Any one of the semiconductor devices described above with reference to FIGS. 2A-5B can be incorporated into any of a myriad of larger and/or more complex systems, a representative example of which is system 690 shown schematically in FIG. 6. The system 690 can include a semiconductor device 600 ("device 600") (e.g., a semiconductor device, package, and/or assembly), a power source 692, a driver 694, a processor 696, and/or other subsystems or components 698. The device 600 can include features generally similar to those devices described above. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, and appliances. Components of the system 690 may be housed in a single unit or distributed over multiple, interconnected units (e.g., through a communications network). The components of the system 690 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A semiconductor assembly, comprising:
    a substrate having a top surface and including a graphene layer below the top surface and configured to transfer thermal energy along a lateral direction across the substrate;
    a semiconductor device over the top surface of the substrate;
    a thermal connector between the substrate and the semiconductor device, the thermal connector being configured to transfer the thermal energy from the semiconductor device to the graphene layer; and
    a heat spreader over the top surface of the substrate and between opposing peripheral edges of the substrate, the heat spreader thermally coupled to the graphene layer.

2. The semiconductor assembly of claim 1, wherein the heat spreader is directly connected to the substrate at a location laterally displaced from the thermal connector.

3. The semiconductor assembly of claim 1, wherein the thermal connector is electrically isolated from circuits within the semiconductor device.

4. The semiconductor assembly of claim 1, wherein thermal connector is electrically connected an electrical ground or a power input for one or more circuits within the semiconductor device.

5. The semiconductor assembly of claim 1, wherein:
    the thermal connector is directly attached to a bottom portion of the semiconductor device; and
    the heat spreader is further thermally coupled to a top portion of the semiconductor device.

6. The semiconductor assembly of claim 1, wherein:
    the substrate is a printed circuit board (PCB),
    the graphene layer is a core of the PCB, and
    the PCB includes thermal paths that thermally couple to and extend from the thermal connector and the heat spreader to graphene layer.

7. The semiconductor assembly of claim 1, wherein:
    the substrate and the semiconductor device comprise a module; and further comprising:
a second substrate coupled to the module, wherein the second substrate includes a second thermal layer coupled to the graphene layer of the module for transferring the thermal energy across the second substrate.

8. The semiconductor assembly of claim 7, wherein the heat spreader is over the second substrate and thermally coupled to the second thermal layer for receiving and dissipating the thermal energy from the semiconductor device.

9. The semiconductor assembly of claim 1, wherein the substrate includes:
an external layer above the graphene layer, the external layer having a top surface; and
a thermal via exposed on the top surface and extending at least partially through the external layer toward the graphene layer, wherein the thermal via couples the thermal connector to the graphene layer.

10. The semiconductor assembly of claim 9, wherein the thermal connector includes solder directly contacting the thermal via.

11. The semiconductor assembly of claim 1, wherein the semiconductor device includes:
a semiconductor substrate;
a circuit formed on or about an active side of the semiconductor substrate; and
a device thermal layer disposed in the semiconductor substrate and between the active side and an opposing side of the substrate, the device thermal layer configured to transfer the thermal energy along a lateral plane across the semiconductor substrate.

12. The semiconductor assembly of claim 11, wherein:
the device substrate includes a Through-Silicon Via (TSV) extending vertically from the opposing side to the device thermal layer; and
further comprising:
a device heat-sink directly attached to the opposing side of the device substrate and thermally coupled to the TSV.

13. The semiconductor assembly of claim 1, wherein the heat spreader is directly attached to the graphene layer.

14. A semiconductor module, comprising:
a module substrate having a first peripheral edge and a second peripheral edge, the module substrate including a module graphene layer extending between the first and second peripheral edges, wherein
the second peripheral edge of the module substrate being configured to structurally and electrically connect to a system substrate,
the module graphene layer being configured to transfer the thermal energy to the system substrate through the second peripheral edge;
a semiconductor device over the module substrate;
a thermal connector directly contacting the module substrate and the semiconductor device, the thermal connector being configured to transfer the thermal energy between the semiconductor device and the module graphene layer; and
a module heat spreader attached to the module substrate, wherein the module heat spreader is thermally coupled to the module graphene layer for dissipating the thermal energy from the graphene layer.

15. The semiconductor module of claim 14, wherein the module heat spreader is directly attached to the first peripheral edge of the module substrate.

16. The semiconductor module of claim 14, wherein:
the semiconductor device is attached to a surface of the module substrate; and
the module heat spreader is attached to the surface of the module substrate and separated from the semiconductor device along a direction parallel to the surface.

17. The semiconductor module of claim 14, further comprising:
a device heat spreader directly attached to the semiconductor device and configured to dissipate heat from the semiconductor device.

18. The semiconductor module of claim 14, further comprising:
a module connector attached to the module substrate and thermally coupled to the module graphene layer, the module connector configured to attach the module substrate to an external fixture and transfer the thermal energy between the module graphene layer and the external fixture.

19. The semiconductor module of claim 18, wherein the semiconductor module comprises a memory module.

20. The semiconductor module of claim 14, wherein the substrate comprises a printed circuit board (PCB) having the graphene layer as a core and a stiffener configured to structurally reinforce the core.

* * * * *